United States Patent
Uchida et al.

(10) Patent No.: US 8,024,158 B2
(45) Date of Patent: Sep. 20, 2011

(54) MANAGEMENT SYSTEM AND MANAGEMENT METHOD OF CAD DATA USED FOR A STRUCTURAL ANALYSIS

(75) Inventors: Takanao Uchida, Saitama (JP); Hideharu Koga, Saitama (JP)

(73) Assignee: Honda Motor Co., Ltd., Tokyo (JP)

(*) Notice: Subject to any disclaimer, the term of this patent is extended or adjusted under 35 U.S.C. 154(b) by 921 days.

(21) Appl. No.: 11/717,718

(22) Filed: Mar. 14, 2007

(65) Prior Publication Data

US 2007/0225953 A1    Sep. 27, 2007

(30) Foreign Application Priority Data

Mar. 27, 2006  (JP) ................................ 2006-085316

(51) Int. Cl.
*G06F 17/50* (2006.01)
(52) U.S. Cl. .......................................................... 703/1
(58) Field of Classification Search ....... 703/1; 706/919
See application file for complete search history.

(56) References Cited

U.S. PATENT DOCUMENTS

| | | | |
|---|---|---|---|
| 7,275,023 B2 * | 9/2007 | Chen et al. .................. | 703/2 |
| 7,372,995 B2 * | 5/2008 | Iwase .......................... | 382/199 |
| 2004/0186702 A1 * | 9/2004 | Okamoto et al. ............ | 703/14 |
| 2005/0197822 A1 * | 9/2005 | Onodera et al. .............. | 703/22 |
| 2005/0228804 A1 * | 10/2005 | Kataoka et al. .............. | 707/100 |
| 2007/0220520 A1 * | 9/2007 | Tajima ........................ | 718/104 |

FOREIGN PATENT DOCUMENTS

| | | | |
|---|---|---|---|
| JP | 11015868 A * | 1/1999 | |
| JP | 2002-092042 | 3/2002 | |
| JP | 2005-100166 A | 4/2005 | |
| JP | 2006-4200 A | 1/2006 | |

* cited by examiner

*Primary Examiner* — Paul Rodriguez
*Assistant Examiner* — Eunhee Kim
(74) *Attorney, Agent, or Firm* — Arent Fox LLP

(57) ABSTRACT

A management system of CAD data is provided, which stores sets of the CAD data, and a set of mesh conditions under which a CAE model is created from each of the sets of the CAD data and a set of analysis conditions under which CAE analysis on the created CAE model is performed associated with each set of the CAD data. Moreover, the management system of CAD data, to perform the CAE analysis on one of the sets of the CAD data, reads from the storage unit the set of the CAD data, and the set of the mesh conditions and the set of the analysis conditions associated with the set of the CAD data, creates the CAE model from the set of the CAD data under the read set of the mesh conditions, and perform the CAE analysis on the created CAE model under the read set of the analysis conditions.

6 Claims, 9 Drawing Sheets

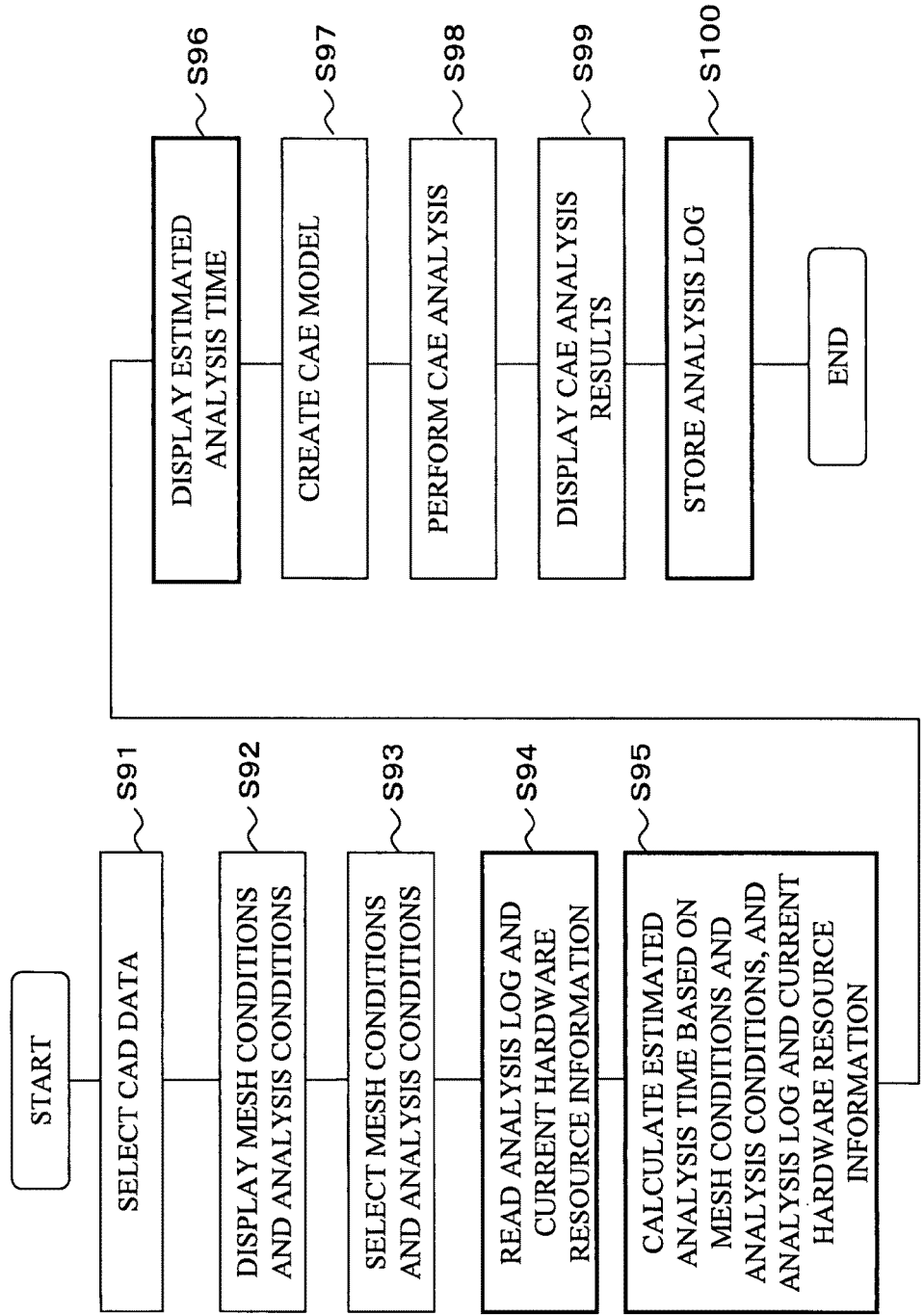

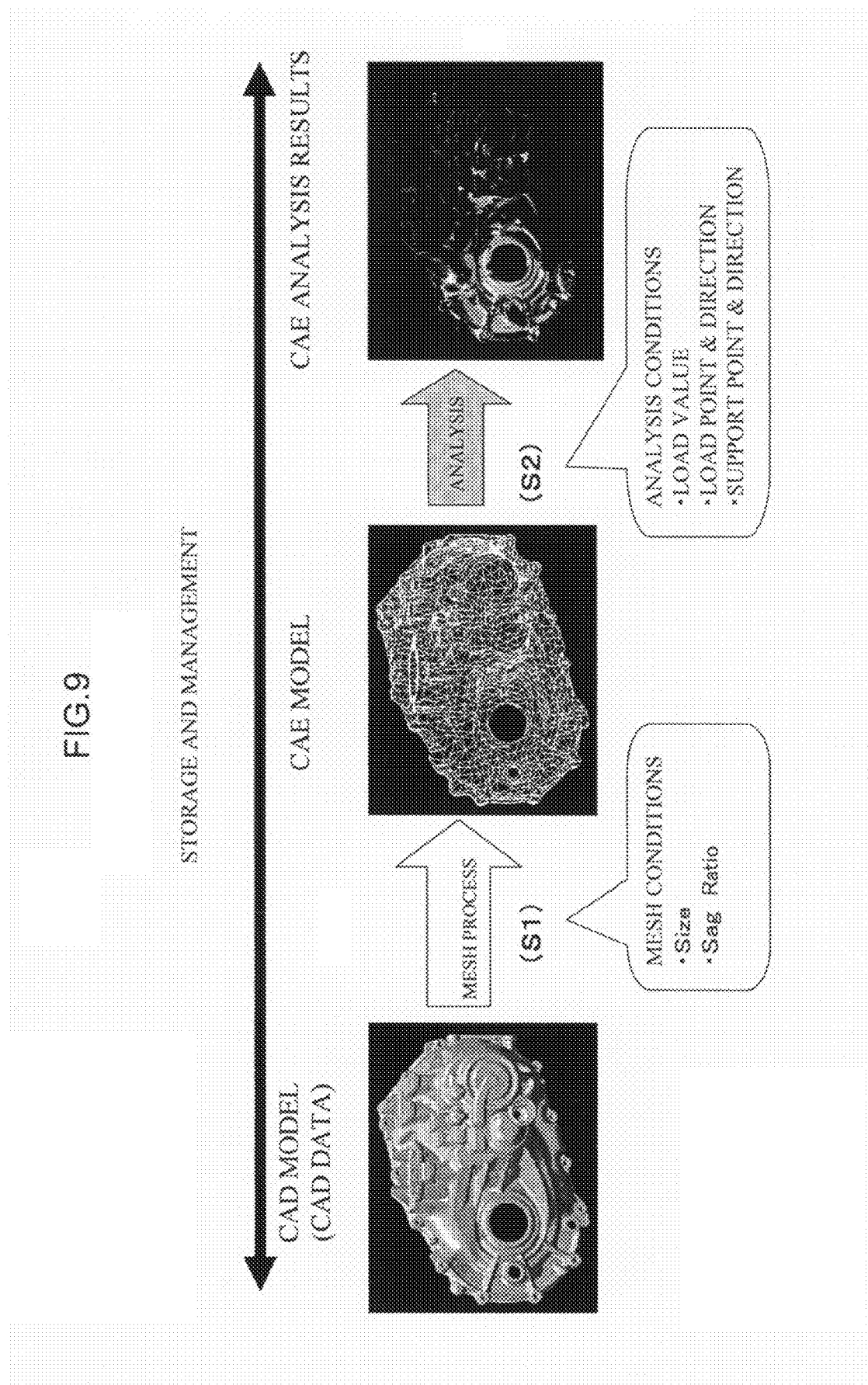

MANAGEMENT SYSTEM AND MANAGEMENT METHOD OF CAD DATA USED FOR A STRUCTURAL ANALYSIS

CROSS REFERENCE TO RELATED APPLICATIONS

This application claims the foreign priority benefit under Title 35, United States Code, §119(a)-(d) of Japanese Patent Application No. 2006-085316, filed on Mar. 27, 2006 in the Japan Patent Office, the disclosure of which is herein incorporated by reference in its entirety.

BACKGROUND OF THE INVENTION

1. Field of the Invention

The present invention relates to a management technology of CAD (Computer Aided Design) data used for a CAE (Computer Aided Engineering) analysis.

2. Description of the Related Art

In general, to accomplish a design of a certain product, the following processes are required. First of all, a two-dimensional draft is drawn, a prototype is created based on the draft, and then the prototype is tested. Consequently, problems are identified in the prototype so that a more perfect draft is drawn. However, repeating creating a prototype requires a long development period and increases cost of the prototypes. Therefore, in recent years, a computer is used for a structural analysis (that is, so-called CAE analysis) of a product based on CAD data in order to shorten the development period (See JP2002-92042A).

The outline of the conventional CAE analysis will be described below.

FIG. 9 is a diagram illustrating the outline of process steps of the conventional CAE analysis.

First of all, a set of mesh conditions are specified for a CAD model (or a set of CAD data) by a computer-aided design system or the like. Then, a mesh process is performed to create a CAE model (S1). The CAE model is a model in which the CAD model is divided into polyhedral meshes to facilitate the CAE analysis. For instance, the mesh conditions include Size, Sag Ratio, and so on which respectively express a size of a triangular mesh, a shape of the triangular mesh, and so on in the CAE model. Size expresses an approximate length of the triangular mesh in the CAE model. Sag Ratio, which is so called aspect (Aspect Ratio), expresses how flat the triangular mesh is. For instance, Sag Ratio expresses a ratio of a length of a long side to that of a short side of the triangular mesh. The larger a value of Sag Ratio is, the flatter the triangular mesh is.

Next, the CAD system specifies a set of analysis conditions of the CAE analysis on the created CAE model, and performs the CAE analysis (S2). The analysis conditions include, for instance, a torque value or a load value, a torque direction or a load direction, a cycle Hz of the load value, and so on.

Conventionally, the mesh process in S1 requires complicated computation and takes as long as about one month even for a specialist in the CAE analysis. Therefore, the CAE model created from the set of the CAD data and a set of analysis results of the CAE analysis need to be stored and managed for later use. In this case, the set of the CAD data, and the CAE model and the set of the analysis results of the CAE analysis are usually managed separately. In addition, the set of the CAD data is often manually associated with the CAE model and the set of the analysis results.

SUMMARY OF THE INVENTION

However, there are problems that it takes much work for a person to manage such files and that relationship between the set of the CAD data and the set of the analysis results of the CAE analysis tends to be unclear. On the other hand, there is a technology which manages a single file including the set of the CAE conditions (mesh conditions and analysis conditions) and the set of the analysis results of the CAE analysis. However, data size of the set of the analysis results of the CAE analysis is very large. Therefore, there are problems of troublesome data handling such as that it is difficult to change the set of the CAD data, that it takes long time to transmit the data, and so on.

In view of the above, an object of the present invention is to provide a management system and a management method of CAD data to solve the above-described problems.

Conventionally, since a lot of work, time, and cost are spent to obtain the analysis results of the CAE analysis, the analysis results are required to be stored for later use. However, technological progresses in hardware and software allow a single machine to perform the CAE analysis, and significantly shorten time spent for the CAE analysis. Moreover, it is expected that the time spent for the CAE analysis will still be shortened in future. In view of such circumstances, the inventors perceived a concept that every time when the analysis results are required, the stored set of the analysis results should not be reloaded, but the analysis should be performed again. The inventors eagerly discussed about how to realize the concept and complete the invention.

To solve the above-described problems, in one aspect of the present invention, there is provided a management system of CAD data including a storage unit which stores a set of the CAD data, and a set of one or more mesh conditions under which a CAE model is created from the set of the CAD data and a set of one or more analysis conditions under which CAE analysis on the created CAE model is performed associated with the set of the CAD data, and a process unit which, to perform the CAE analysis on the set of the CAD data, reads from the storage unit the set of the CAD data, and the set of the mesh conditions and the set of the analysis conditions associated with the set of the CAD data, creates the CAE model from the read set of the CAD data under the read set of the mesh conditions, and performs the CAE analysis on the created CAE model under the read set of the analysis conditions.

In this configuration, each set of the CAD data is associated with the set of the mesh conditions and the set of the analysis conditions (a set of CAE conditions). Therefore, it is merely required to perform the CAE analysis under the set of the CAE conditions every time when a set of analysis results of the CAE analysis is required. In other words, it is unnecessary to manage the set of the analysis results of the CAE analysis separately.

The management system of the CAD data may further include an input and a display. In the management system, each set of the CAD data may be associated with a part in a product. Moreover, the process unit may read from the storage unit one or more sets of the CAD data which are respectively associated with one or more parts in the product, display in the display one or more CAD models of the one or more parts respectively created from the read one or more sets of the CAD data, select a CAD model of a part among the displayed CAD models of the one or more parts through the input, read from the storage unit a set of the mesh conditions and a set of the analysis conditions associated with one of the one or more sets of the CAD data which is associated with the selected CAD model of the part, and perform the CAE analysis on the set of the CAD data which is associated with the selected part under the read set of the mesh conditions and set of the analysis conditions.

In this configuration, the management system can perform the CAE analysis on each part in the product.

In the management system of the CAD data, the process unit, when performing the CAE analysis on the set of the CAD data, may store in the storage unit a set of analysis information which includes an analysis time which has been taken for the CAE analysis, and is associated with the set of the CAD data, the set of the mesh conditions, and the set of the analysis conditions. When the CAD model of the part which is associated with the set of the CAD data is selected among the displayed CAD models of the one or more parts through the input, the process unit may display in the display the set of the analysis information which is associated with the set of the CAD data and stored in the storage unit.

In this configuration, a user of the management system can learn in advance the analysis time which have been taken for the past CAE analysis.

In the management system of the CAD data, the set of the analysis information may further include a set of analysis hardware information which is a set of information about hardware which has been used for the CAE analysis. In addition, when the CAD model of the part which is associated with the set of the CAD data is selected among the displayed CAD models of the one or more parts through the input, the process unit may read the set of the analysis information, the set of the mesh conditions, and the set of the analysis conditions, which are associated with the set of the CAD data and stored in the storage unit. Then, the process unit may calculate an estimated analysis time which is to be taken for a following CAE analysis on the set of the CAD data based on the read set of the analysis information, set of the mesh conditions, and set of the analysis conditions, and a set of current hardware information of the management system. Moreover, the process unit may display in the display the calculated estimated analysis time.

In this configuration, the management system displays in the display the estimated analysis time which is calculated in accordance with hardware resources (a CPU (Central Processing Unit), a memory, and so on) in a current management system. Therefore, a user can obtain the analysis time which is closer to an actual analysis time for the CAE analysis even when hardware resources have changed in the management system.

In another aspect of the present invention, there is provided a management method of CAD data in a management system of CAD data, the management system including a storage unit which stores a set of CAD data, and a set of one or more mesh conditions under which a CAE model is created from the set of the CAD data and a set of one or more analysis conditions under which CAE analysis on the created CAE model is performed associated with the set of the CAD data. To perform the CAE analysis on the set of the CAD data, the management method includes the steps of reading from the storage unit the set of the CAD data, the set of the mesh conditions and the set of the analysis conditions associated with the set of the CAD data, creating the CAE model from the set of the CAD data under the read set of the mesh conditions, and performing the CAE analysis on the created CAE model under the read set of the analysis conditions.

In this method, the set of the CAD data has the set of the mesh conditions and the set of the analysis conditions (a set of CAE conditions). Therefore, it is merely necessary to perform the CAE analysis under the set of the CAE conditions every time when a set of analysis results of the CAE analysis is required. In other words, it is unnecessary to manage the set of analysis results of the CAE analysis separately.

The management method of the CAD data may further include the steps of storing an analysis time which has been taken for the CAE analysis on the set of the CAD data, associated with the set of the CAD data, the set of the mesh conditions, and the set of the analysis conditions, and reading from the storage unit and displaying in the display the analysis time associated with the set of the CAD data, the set of the mesh conditions, and the set of the analysis conditions.

In this method, a user of the management system can learn the analysis time which the management system has taken for the past CAE analysis.

BRIEF DESCRIPTION OF THE DRAWINGS

The object and features of the present invention will become more readily apparent from the following detailed description taken in conjunction with the accompanying drawings in which:

FIG. 8 is a flowchart showing process steps in the management system of the third embodiment; and FIG. 9 is a diagram illustrating process steps in a conventional CAE analysis.

DESCRIPTION OF THE PREFERRED EMBODIMENTS

Here will be described embodiments of the present invention, referring to the accompanying drawings as needed.

First Embodiment

First of all, referring to FIG. 1, features of a management system of CAD data (hereafter, referred to as merely a management system) according to an embodiment of the invention will be described.

Figure 1:
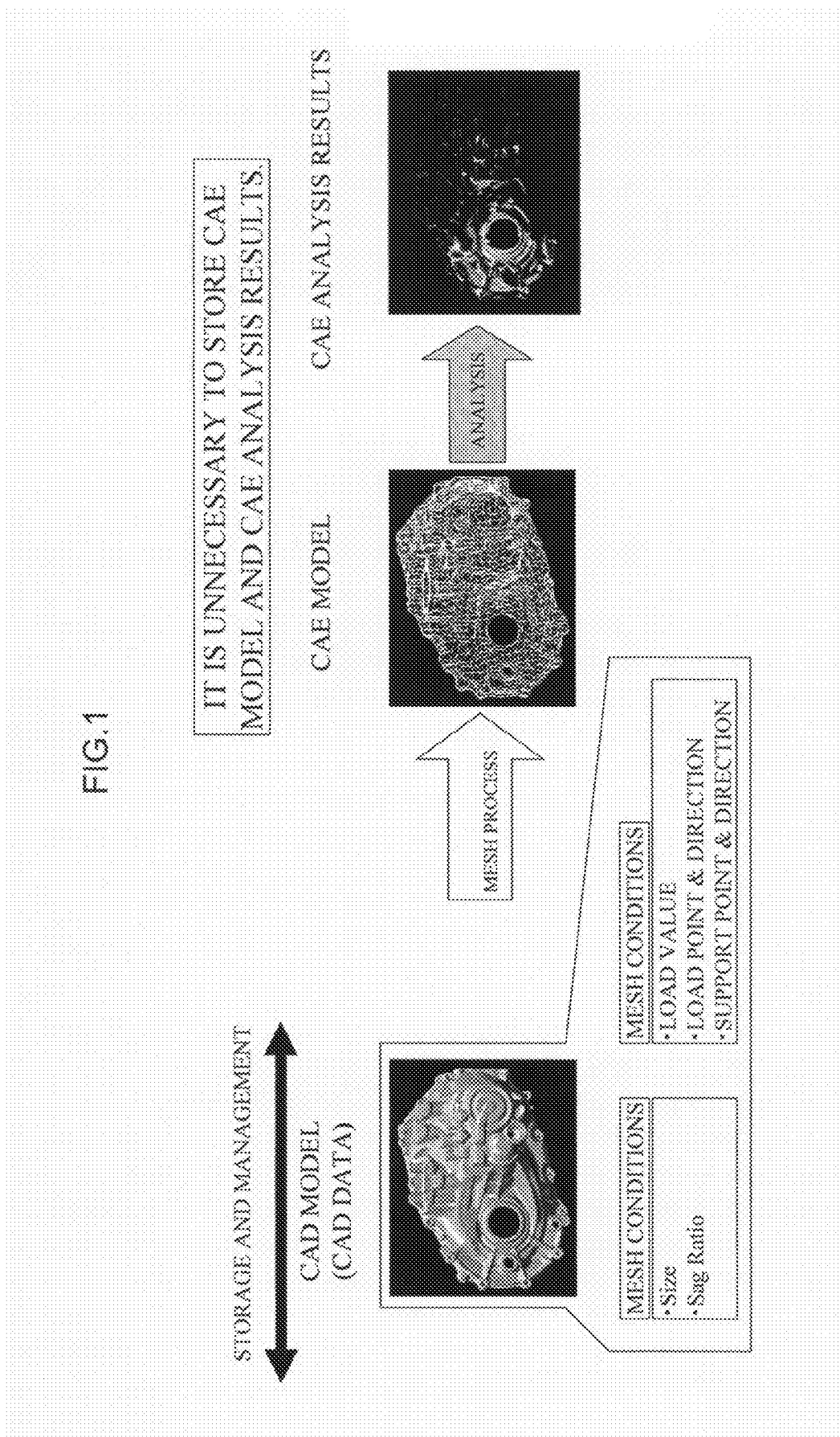
FIG. 1 is a diagram illustrating features of a management system according to a present embodiment.

FIG. 1 is a diagram illustrating the features of the management system according to the present embodiment. The management system of the present embodiment stores and manages a CAD model (a set of CAD data) associated with a set of one or more mesh conditions and a set of one or more analysis conditions. That is to say, the management system is characterized in that a CAE model and a set of the CAE analysis results are not in particular stored or managed. In other words, the management system creates the CAE model based on the set of the mesh conditions associated with the set of the CAD data every time when the set of the analysis results of the CAE analysis is required. Then, the management system performs the CAE analysis on the CAE model under the set of analysis conditions. Therefore, it is unnecessary to store the CAE model and the set of the CAE analysis results for later use.

Figure 2:
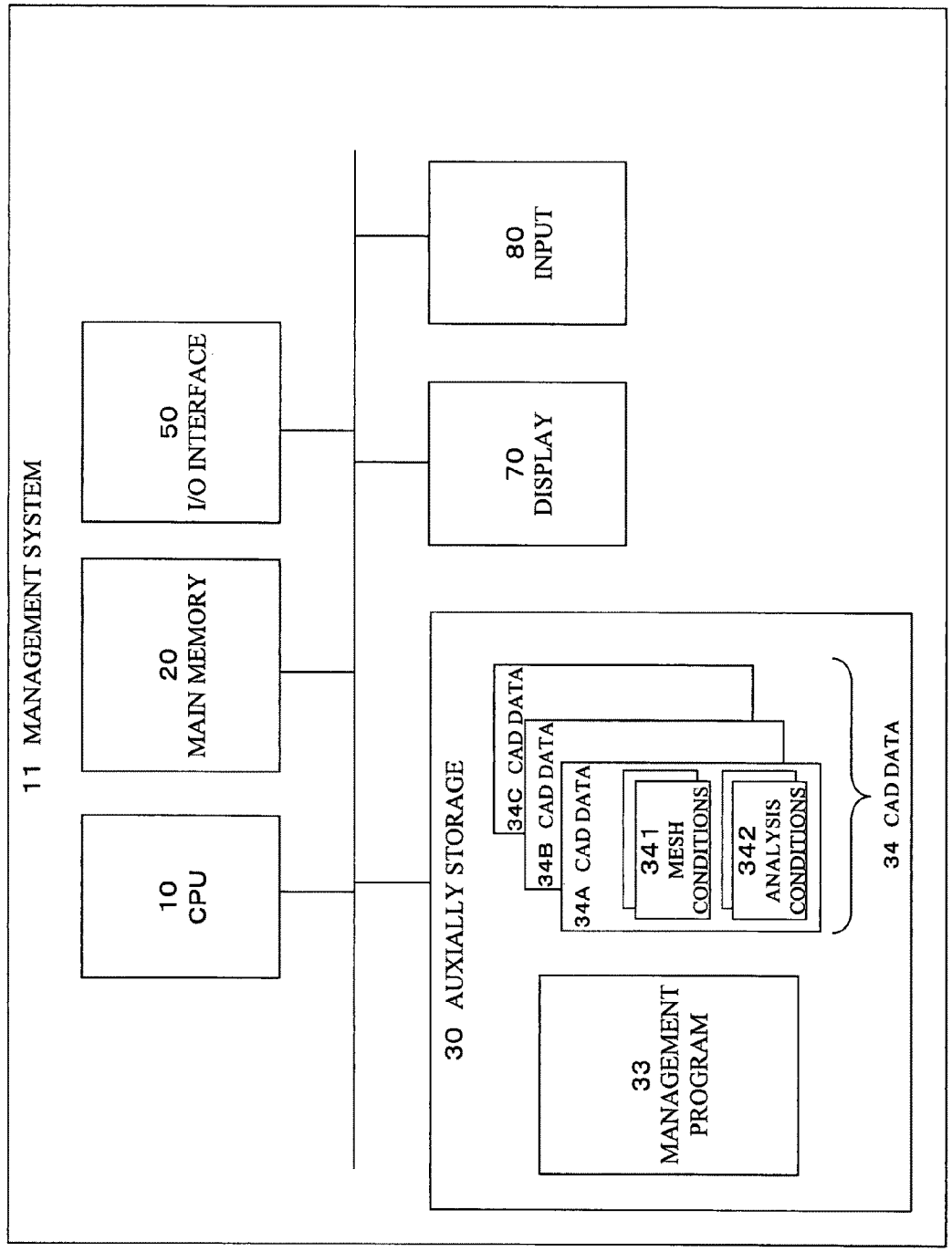
FIG. 2 is a block diagram showing a hardware configuration of the management system according to the present embodiment.

Next, referring to FIG. 2, a hardware configuration of the management system of the present embodiment will be described. FIG. 2 is a block diagram showing the hardware configuration of the management system of the present embodiment. As shown in FIG. 2, the management system 11 is implemented in a computer including a CPU 10 which performs various kinds of operations, a main memory 20 which is a storage used for the operations, an auxially storage 30 which stores a management program 33, sets of CAD data 34, and so on, an I/O interface 50 which manages input and output of data through external I/Os, a display 70 which displays results of the operations performed by the CPU 10, and an input 80 through which various kinds of instructions to the CPU 10 are input.

For instance, the main memory 20 is realized by a semiconductor memory or the like such as a RAM (Random Access Memory) and the like. The auxially storage 30 (storage) is realized by a hard disk drive or the like. Moreover, the display 70 is realized by a liquid crystal monitor or the like. The input 80 is realized by an input device or the like such as a keyboard, a mouse, and so on.

The auxially storage 30 stores the management program 33 and the sets of the CAD data 34. The management program 33 is an essential program in the management system 11. The CPU 10 executes the management program 33 to realize functions of the management system 11. The management program 33 includes a CAE process program which creates the CAE model and performs the CAE analysis.

The sets of the CAD data 34 (34A, 34B, and 34C) are CAD data for which the management system 11 performs the CAE analysis. Each of the sets of the CAD data 34 (34A, 34B, and 34C) includes a set of one or more mesh conditions 341 under which a CAE model is created from the set of the CAD data 34 (34A, 34B, and 34C) and a set of one or more analysis conditions 342 under which a CAE analysis is performed for the CAE model. The set of the mesh conditions 341 includes, for instance, Size, Sag Ratio, and so on. The set of the analysis conditions 342 includes, for instance, a torque value or a load value, a torque direction or a load direction, a cycle Hz of the load value. The set of the analysis conditions 342 may include conditions of a breakdown.

At first, the set of the CAD data 34 is associated with neither the set of the mesh conditions 341 nor the set of the analysis conditions 342 (CAE conditions). Thus, the management system 11 associates the set of the CAE conditions with the set of the CAD data 34, afterward. When performing the CAE analysis, the management system 11 may associate the set of the CAE conditions which has been used for the CAE analysis with the set of the CAD data 34. Moreover, the management system 11 may associate the set of the CAE conditions with the set of the CAD data 34 based on information input through the input 80 or the I/O interface 50 by a user.

In addition, the set of the CAE conditions may include boundary conditions and contact conditions for the set of the CAD data (object) 34. The boundary condition is a condition concerning a boundary of an object. For instance, the boundary condition includes a condition which expresses how an object is constrained by a wall or is rotatable on the wall when the object is installed on the wall. Meanwhile, the contact condition is a condition concerning contact surfaces of objects. For instance, the contact condition includes a condition which expresses whether a contact surface of an object may slip on the other contact surface of the other object or the contact surface is fixed to the other contact surface when the contact surfaces are in contact with each other.

Moreover, a plurality of the mesh conditions 341 and the analysis conditions 342 may be associated with a single set of the CAD data (CAD file) 34. The following description mainly will be given to a case where the plurality of the mesh conditions 341 and the analysis conditions 342 are associated with the single set of the CAD data 34. However, a single mesh condition 341 or analysis condition 342 may be associated with the single set of the CAD data 34.

Figure 3:
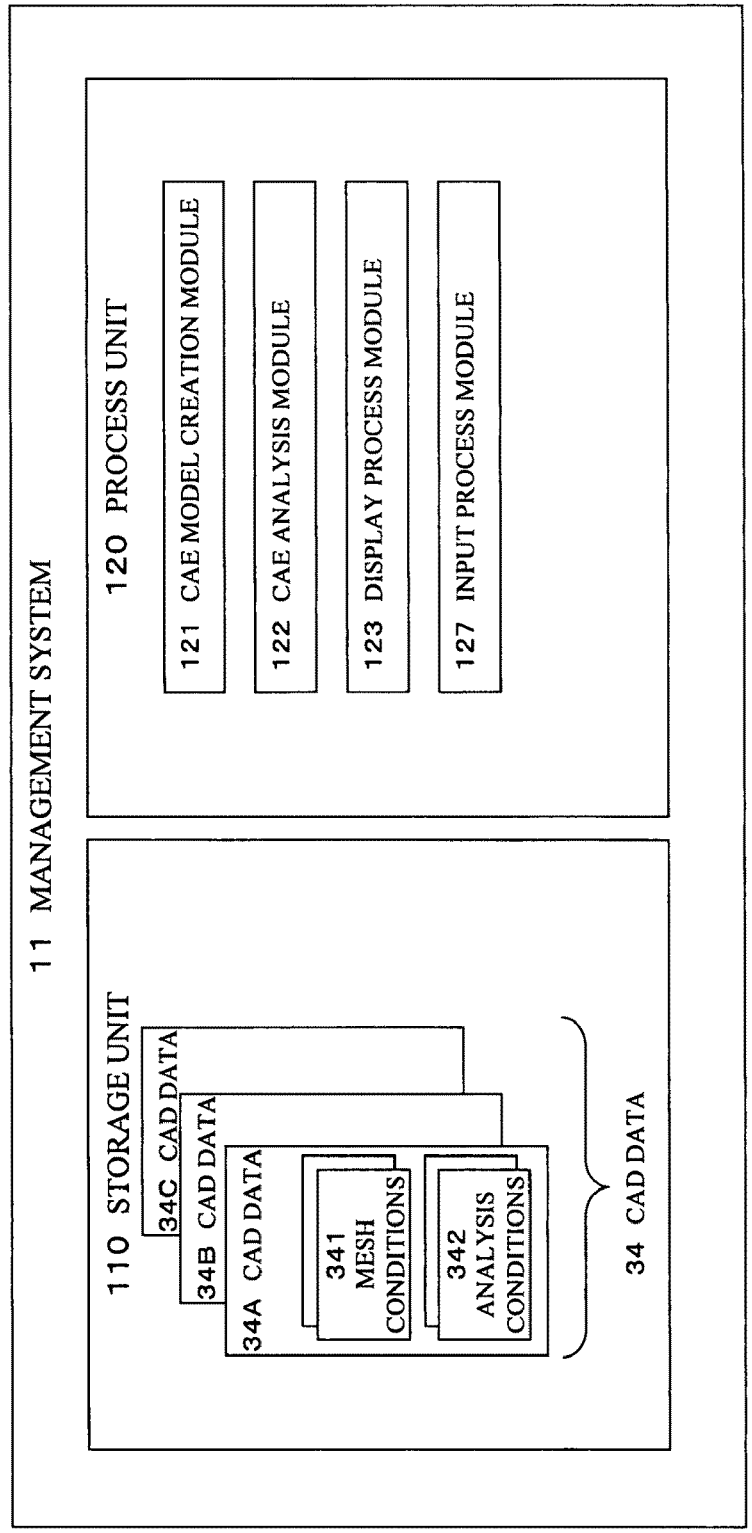
FIG. 3 is a block diagram showing functions in the management system in FIG. 2.

Next, referring to FIG. 3, functions in the management system 11 will be described. FIG. 3 is a block diagram showing functions in the management system in FIG. 2. In other words, FIG. 3 shows a state where the management program 33 and various kinds of data are loaded from the storage 30 to the main memory 20 in FIG. 2 to realize a process unit 120 and a storage unit 110.

The storage unit 110 stores the sets of the CAD data 34. The process unit 120 reads the set of the CAD data 34 stored in the storage unit 110 and performs the CAE analysis on the set of the CAD data 34.

The process unit 120 includes a CAE model creation module 121, a CAE analysis module 122, a display process module 123, and an input process module 127.

The CAE model creation module 121 reads the set of the CAD data 34 from the storage unit 110 and creates the CAE model from the set of the CAD data 34 under the set of the mesh conditions 341 included in the set of the CAD data 34.

The CAE analysis module 122 performs the CAE analysis on the CAE model created by the CAE model creation module 121 under the set of the analysis conditions 342 included in the set of the CAD data 34.

The display process module 123 controls display in the display 70. For instance, the display process module 123 displays in the display 70 a set of analysis results of the CAE analysis performed by the CAE analysis module 122, and so on. Moreover, the display process module 123 displays in the display 70 the set of the mesh conditions 341 and the set of the analysis conditions 342 included in the set of the CAD data 34 and a screen where these conditions are to be selected.

The input process module 127 transfers information input through the input 80 and the I/O interface 50 in FIG. 2 to the CAE model creation module 121, the CAE analysis module 122, and the display process module 123.

Figure 4:
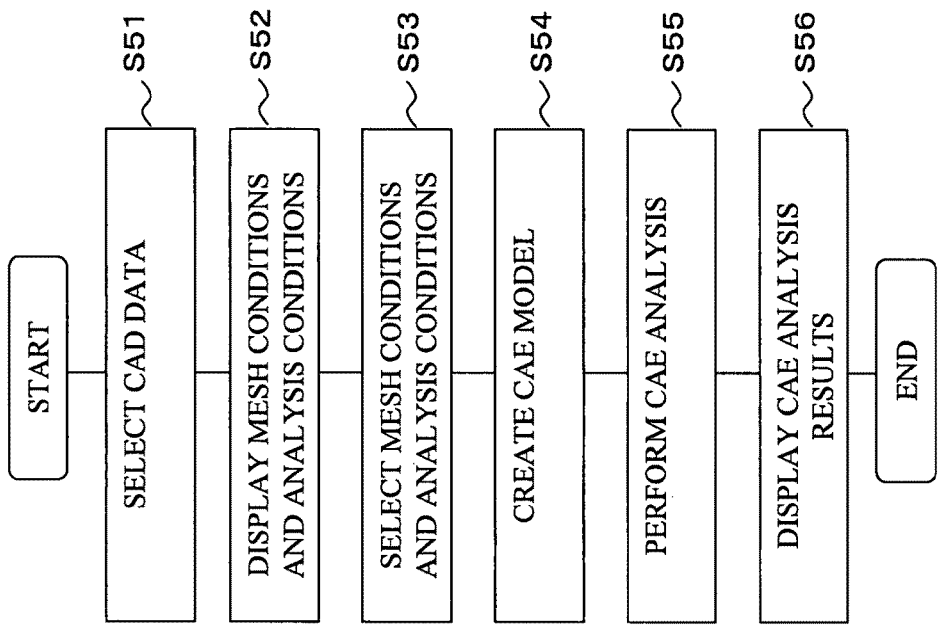
FIG. 4 is a flowchart showing process steps in the management system in FIG. 3.

Next, referring to FIG. 4, process steps of the management system 11 will be described. FIG. 4 is a flowchart showing the process steps of the management system in FIG. 3.

First of all, the management system 11 in advance specifies a set of the mesh conditions 341 and a set of the analysis conditions 342 for each of the sets of the CAD data 34 stored in the storage unit 110.

Then, the input process module 127 specifies which one of the sets of the CAD data 34 is selected through the input 80 (S51). Then, the display process module 123 reads from the storage unit 110 the selected set of the CAD data 34, and a set of the mesh conditions 341 and a set of the analysis conditions 342 included in (associated with) the selected set of the CAD data 34. Next, the display process module 123 displays in the display 70 a screen where some of the mesh conditions 341 and the analysis conditions 34 under which the CAE analysis is performed are selected for the selected set of the CAD data 34 (S52). An example of the screen at this time will be described later, referring to FIG. 5.

Then, the input process module 127 specifies which conditions of the set of the mesh conditions 341 and the set of the analysis conditions 342 are selected for the set of the CAD data 34 through the input 80 (S53). The CAE model creation module 121 creates a CAE model from the set of the CAD data 34 selected in S51 under the mesh conditions 341 selected in S53 (S54). Next, the CAE analysis module 122 performs the CAE analysis on the CAE model created in S54 under the analysis conditions 342 selected in S53 (S55). Then, the display process module 123 displays in the display 70 a set of analysis results of the CAE analysis (S56).

Figure 5:
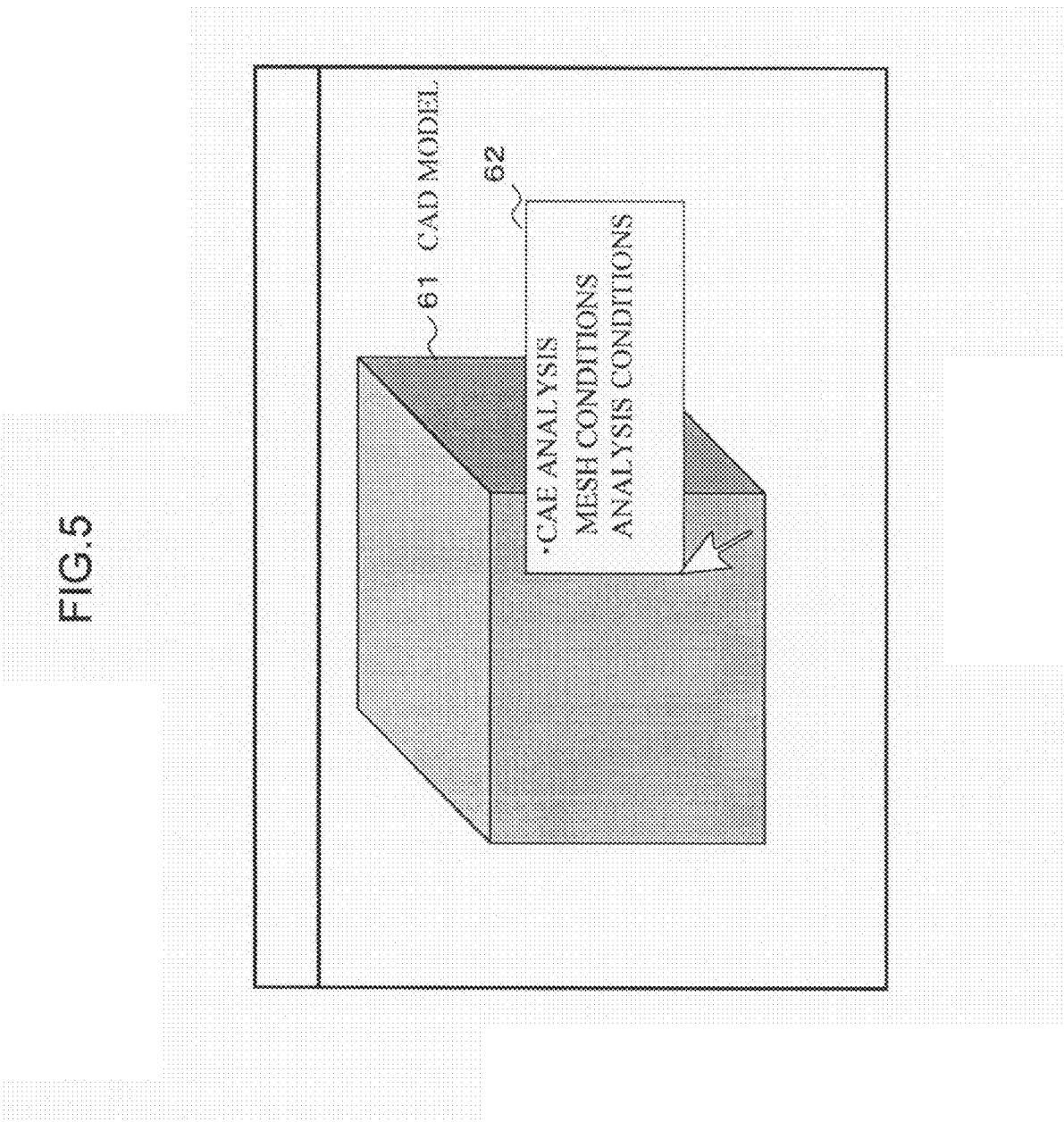
FIG. 5 is a diagram illustrating a screen where mesh conditions and analysis conditions are selected according to the present embodiment.

Here, referring to FIG. 5, a description will be given to the screen where some conditions of the set of the mesh conditions 341 and the set of the analysis conditions 342 are selected in the above-described S52. FIG. 5 is a diagram illustrating the screen where some conditions of the set of the mesh conditions and the set of the analysis conditions are selected according to the present embodiment.

As shown in FIG. 5, the screen which shows a CAD model 61, and menus of the set of the mesh conditions 341 and the set of the analysis conditions 342 under which the CAE analysis is performed for the CAD model 61 are displayed in the display 70 (See a reference number 62). For instance, the CAD model 61 is a 3D model created from the set of the CAD data 34 selected in S51 in FIG. 4. The display process module 123 in FIG. 3 detects that the CAD model 61 is selected through a pointing device such as a mouse and the like and then pops up a selection menu as designated by a reference number 62.

A user of the management system 11 can select some of the mesh conditions 341 and the analysis conditions 342 for the set of the CAD model 61 with checking the CAD model 61 through the screen displayed by the display process module 123.

By the way, in the above-described embodiment, the sets of the CAD data 34A-34C may be sets of the CAD data for respectively different products or respectively different parts in a product. In a case where the sets of the CAD data 34A-34C are sets of the CAD data for respectively different parts, the sets of the CAD data 34A-34C include information about positional relationship among the parts, for instance. Then, the display process module 123 displays the parts combined based on the information about the positional relationship.

Figure 6:
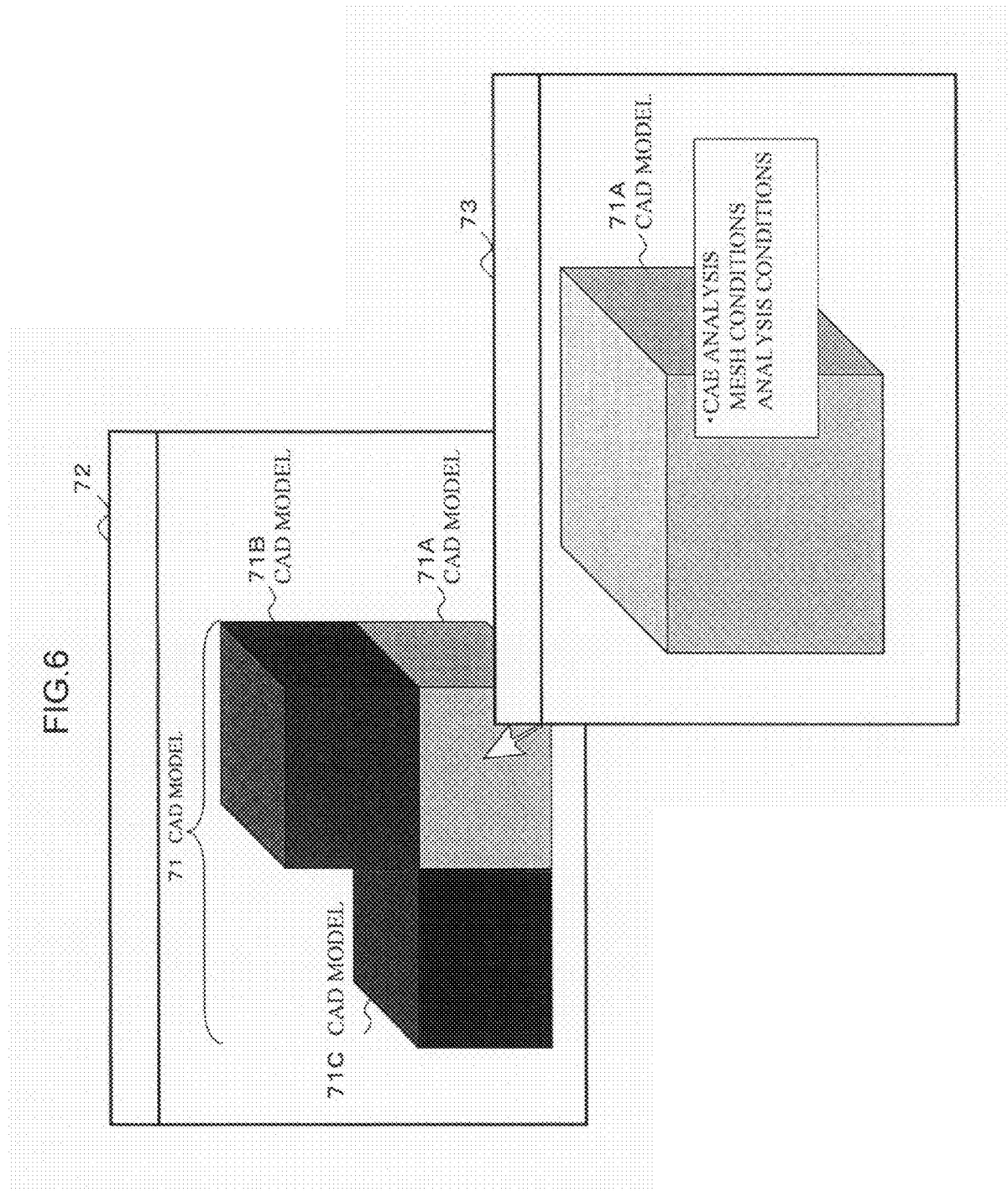
FIG. 6 is a diagram illustrating a screen which is displayed by the management system according to the present embodiment.

Referring to FIG. 6, a screen displayed in this case will be described. FIG. 6 is a diagram illustrating the screen displayed by the management system of the present embodiment.

In FIG. 6, CAD models 71A, 71B, and 71C are CAD models of different parts respectively created from the sets of the CAD data 34A, 34B and 34C in FIG. 3. In this case, to obtain information about which one of the sets of the CAD data 34 is selected in S51 in FIG. 4, the display process module 123 displays the screen which shows combined CAD models 71A-71C (See a screen 72 in FIG. 6).

After that, in the screen, a CAD model 71 (the CAD model 71A, for instance) of a desired part is selected through the input 80 such as a mouse and the like. Then, the display process module 123 displays a screen which shows the selected CAD model 71A and a set of the mesh conditions 341 and a set of the analysis conditions 342 for the selected CAD model 71A (see a screen 73). Then, some conditions of the set of the mesh conditions 341 and the set of the analysis conditions 342 are selected in the screen. Thus, the process unit 120 performs the CAE analysis on the set of the CAD data 34 from which the CAD model of the desired part is created under the selected conditions of the mesh conditions 341 and the analysis conditions 342 similarly to the above-described S54-S56. Then, the process unit 120 displays a set of analysis results of the CAE analysis on the desired part in the display 70.

Thus, a user can obtain a set of the results of the CAE analysis on each part. Moreover, the management system 11 thus displays the CAD models and performs the CAE analysis so that it becomes easy for a user to verify a DMU (Digital Mock-Up). In addition, since each of the sets of CAD data 34 in the management system 11 includes a set of the CAE conditions, points to be examined and evaluation of materials are clarified and simplified in a designing process by a user (designer or the like). In other words, a user can use the sets of the CAD data 34 as a design guide when the user designs.

Second Embodiment

Next, the second embodiment according to the present invention will be described. The second embodiment is characterized in that the management system 11 displays an analysis time which has been taken for a past CAE analysis. In other words, it is characterized in that a user can obtain an approximate analysis time which is to be taken for the following CAE analysis performed by the management system 11.

Figure 7:
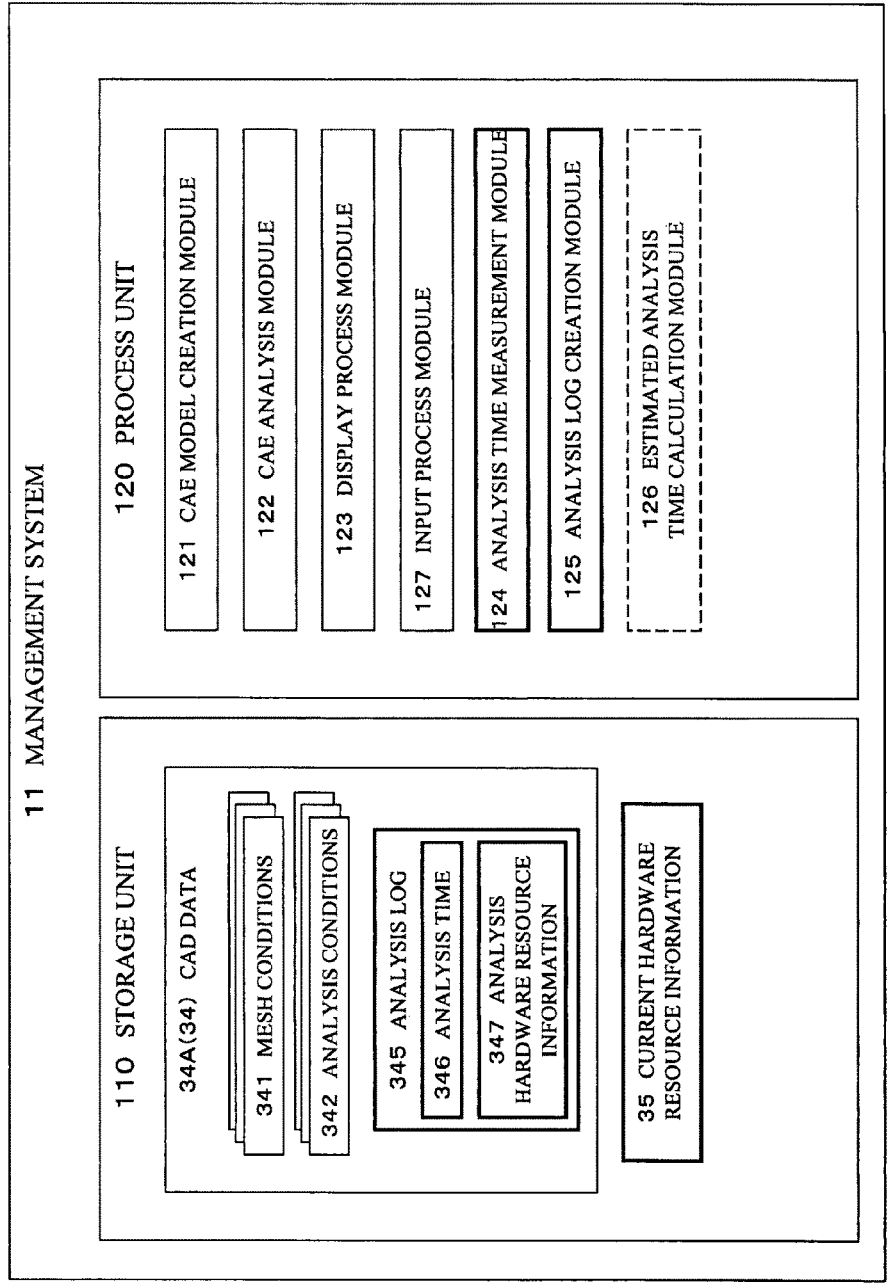
FIG. 7 is a block diagram showing functions in a management system according to the second and third embodiments.

Referring to FIG. 7, functions of the management system 11 will be described. FIG. 7 is a block diagram showing functions of the management system of the second and third embodiments. Elements or parts similar to the first embodiment are designated with the same references and not described here.

As shown in FIG. 7, the storage unit 110 of the management system 11 further stores a set of current hardware resource information (current hardware information) 35 which is a set of information about hardware resources currently being used in the management system 11. The process unit 120 further includes an analysis time measurement module 124 and an analysis log creation module 125. The current hardware resource information 35 may include information about a type and a version of an OS (Operating System) in the management system 11 and the CAE analysis program included in the management program 33. Meanwhile, an estimated analysis time calculation module 126 indicated by the dashed line will be described in the third embodiment.

The analysis time measurement module 124 measures the analysis time 346 which has been taken for the CAE analysis on the set of the CAD data 34.

The analysis log creation module 125 creates an analysis log (analysis information) 345 which is information about the CAE analysis which has been performed and stores the created analysis log 345 in the set of the CAD data 34 in the storage unit 110. The analysis log 345 is information including the above-described analysis time 346 and a set of analysis hardware resource information (analysis hardware information) 347. When the CAE analysis is performed, the set of the current hardware resource information 35 of the management system 11 (for instance, information about the CPU and the memory) may be written in the set of the analysis hardware resource information 347. The set of the analysis hardware resource information 347 is used in the third embodiment.

In FIG. 7, the set of the mesh conditions 341 and the set of the analysis conditions 342 are shown separately from the analysis log 345. However, it is obvious that the set of the mesh conditions 341 and the set of the analysis conditions 342 can be stored as a part of the analysis log 345.

In the management system 11, for instance, the display process module 123 can display the analysis time 346 for the set of the CAD data 34 with the set of the mesh conditions 341 and the set of the analysis conditions 342 before the CAE analysis is performed for the set of the CAD data 34. Therefore, a user can check how much time is taken for the CAE analysis which is to be performed again for the set of the CAD data 34. The analysis time 346 at this time may be displayed with the CAD model as shown in FIG. 5, or in a table such as a table 1 shown below.

TABLE 1

| Name of<br>CAD Data File | Mesh<br>Conditions | Analysis<br>Conditions | Analysis<br>Time |
|---|---|---|---|
| AAA | BBB | CCC | DDD |
| AAA | EEE | FFF | GGG |
| HHH | III | JJJ | KKK |
| ... | ... | ... | ... |

For instance, the table 1 shows that it has taken an analysis time "DDD" to analyze a set of CAD data 34 in a file named "AAA" under a set of mesh conditions "BBB" and a set of analysis conditions "CCC". Moreover, the table 1 also shows that it has taken an analysis time "GGG" to analyze the set of the CAD data 34 in the same file named "AAA" under a set of mesh conditions "EEE" and a set of analysis conditions "FFF".

In a case where the management system 11 stores no analysis results of the CAE analysis and performs calculation for the CAE analysis every time when the analysis results are required, it is advantageous that the analysis time 346 is displayed in this way and a user can learn the analysis time in advance.

Third Embodiment

Next, the third embodiment according to the present invention will be described. The third embodiment is characterized in that the management system 11 displays an estimated analysis time which is to be taken to perform the following CAE analysis. Referring to a block diagram in FIG. 7, the third embodiment will be described below. Elements or parts similar to the first and second embodiments are designated with the same references and not described here.

As shown in FIG. 7, the process unit 120 in the management system 11 further includes an estimated analysis time calculation module 126 which calculates the estimated analysis time which is to be taken to perform the following CAE analysis. Referring to a flowchart in FIG. 8, the estimated analysis time calculation module 126 will be described in detail.

FIG. 8 is a flowchart showing process steps in the management system of the third embodiment.

Process steps in S91-S93 in FIG. 8, which are similar to the process steps in S51-S53 in FIG. 4, are not described here. Therefore, process steps starting from S94 will be described.

The estimated analysis time calculation module 126 in the management system 11 reads an analysis log 345 in the set of the CAD data 34 selected in S91 and a set of the current hardware resource information 35 (S94). Then, the estimated analysis time calculation module 126 calculates an estimated analysis time based on some of the mesh conditions 341 and the analysis conditions 342 selected in S93, and the analysis log 345 and the set of the current hardware resource information 35 read in S94 (S95). Thus, the display process module 123 displays the calculated estimated analysis time in the display 70 (S96). After that, the process unit 120 creates a CAE model, performs the CAE analysis on the created CAE model, and displays the set of the analysis results of the CAE analysis similarly to the process steps in S54-S56 in FIG. 4 (S97-S99). Consequently, the analysis log creation module 125 stores an analysis log 345 of the CAE analysis for this time in the set of the CAD data 34 (S100).

Thus, the management system 11 calculates the estimated analysis time based on the current hardware resource information 35 of the management system 11 itself. Therefore, even when some changes such as adding a memory and the like are made in the management system 11, it is possible to obtain a more accurate estimated analysis time. In a background process or the like, it is also possible to calculate the estimated analysis time based on resource information (the set of the current hardware resource information 35) which expresses hardware resources currently available. Moreover, it is also possible to calculate the estimated analysis time in consideration of information such as a type and a version of an OS and the CAE analysis program, and so on. Thus, even in a case where another OS is used, or after the version is upgraded, it is possible to accurately calculate the estimated analysis time.

Other Embodiments

In the above-described embodiments, in a case where some conditions of the set of the mesh conditions 341 and the set of the analysis conditions 342 have been actually used for calculation (creation of a CAE model and the CAE analysis on the created CAE model) and the rest of the conditions have not, each condition the set of the mesh conditions 341 and the set of the analysis conditions 342 may include information about whether the condition has been actually used or not. The condition including such information allows a user of the management system 11 to check whether the CAE analysis on the set of the CAD data 34 has been actually performed under the condition, afterward.

Moreover, the CAD data 34 may include information about display conditions for the display 70. Then, the display process module 123 may display the CAD model, the set of the CAE analysis results, the set of the mesh conditions 341, the set of the analysis conditions 342, and so on in the display 70 under the display conditions.

The management system 11 according to the present embodiment may be realized by the management program 33 which performs the above-described processes. Thus, it is possible to provide a computer readable storage medium (CD-ROM, and so on) which stores the program. Moreover, it is also possible to provide the program through a network such as the Internet or the like.

According to the present invention, a set of CAD data managed by a management system includes a set of mesh conditions and a set of analysis conditions (CAE conditions). Therefore, it is only required to perform CAE analysis under the set of the CAE conditions to obtain a set of analysis results of the CAE analysis. In other words, since it is not required to separately manage the set of the analysis results of the CAE analysis, it is easy to manage data files. As described above, conventionally, it took about one month to perform the CAE analysis including creation of the CAE model for the CAE analysis. However, computer performance improved in recent years shortens the time taken for the CAE analysis including the creation of the CAE model, to about 10-20 minutes. In other words, it is relatively easy to obtain the analysis results of the CAE analysis as long as the set of the CAE conditions is stored for the set of the CAD data. Accordingly, it is considered that it is exceedingly effective to apply the present invention to a management system of CAD data.

Moreover, the set of the CAD data managed by the management system according to the present invention does not include the set of the analysis results of the CAE analysis.

Therefore, it is easy to modify the set of the CAD data and perform the CAE analysis on each part. In addition, it is possible to improve portability of the CAD data to another system.

Furthermore, the management system according to the present invention displays the analysis time which has been taken for the previous CAE analysis and the estimated analysis time which is to be taken for the following CAE analysis. Therefore, it is easy for a user to use the management system.

While the described embodiments represent the preferred forms of the present invention, it is to be distinctly understood that the invention is not limited thereto but may be otherwise variously embodied within the spirit and scope of the following claims.

What is claimed is:

1. A management system of CAD data comprising:
a storage unit which stores a set of the CAD data together with a set of one or more mesh conditions under which a CAE model is created from the set of the CAD data and a set of one or more analysis conditions under which CAE analysis on the created CAE model is performed associated with the set of the CAD data; and
a process unit which, to perform the CAE analysis on the set of the CAD data, reads from the storage unit the set of the CAD data, and the set of the mesh conditions and the set of the analysis conditions associated with the set of the CAD data, creates the CAE model from the read set of the CAD data under the read set of the mesh conditions, and performs the CAE analysis on the created CAE model under the read set of the analysis conditions,
wherein the process unit when performing the CAE analysis on the set of the CAD data, is configured to store in the storage unit a set of analysis information, the set of analysis information including an analysis time which has previously been taken for the CAE analysis using the stored combination of the set of the CAD data, the set of the mesh conditions, and the set of the analysis conditions, and
wherein when a CAD model of the part associated with the set of the CAD data is selected among the displayed CAD models of the one or more parts through an input, the process unit is configured to display the set of the analysis information associated with the stored combination of the set of the CAD data, the set of mesh conditions and the set of analysis conditions including the stored analysis time before the CAE analysis is performed.

2. The management system as claimed in claim 1, further comprising an input and a display,
wherein each set of the CAD data is associated with a part in a product, and
wherein the process unit
reads from the storage unit one or more sets of the CAD data which are respectively associated with one or more parts in the product,
displays in the display one or more CAD models of the one or more parts respectively created from the read one or more sets of the CAD data,
selects a CAD model of a part among the displayed CAD models of the one or more parts through the input,
reads from the storage unit a set of the mesh conditions and a set of the analysis conditions associated with one of the one or more sets of the CAD data which is associated with the selected CAD model of the part, and
performs the CAE analysis on the set of the CAD data which is associated with the selected part under the read set of the mesh conditions and set of the analysis conditions.

3. The management system as claimed in claim 2, wherein
the set of the analysis information further comprises a set of analysis hardware information which is a set of information about hardware which has been used for the CAE analysis, and wherein
the process unit when the CAD model of the part which is associated with the set of the CAD data is selected among the displayed CAD models of the one or more parts through the input,
reads the set of the analysis information, the set of the mesh conditions, and the set of the analysis conditions, which are associated with the set of the CAD data and stored in the storage unit,
calculates an estimated analysis time which is to be taken for a following CAE analysis on the set of the CAD data based on the read set of the analysis information, set of the mesh conditions, and set of the analysis conditions, and a set of current hardware information of the management system, and
displays in the display the calculated estimated analysis time.

4. The management system as claimed in claim 1, wherein
the set of the analysis information further comprises a set of analysis hardware information which is a set of information about hardware which has been used for the CAE analysis, and wherein
the process unit when the CAD model of the part which is associated with the set of the CAD data is selected among the displayed CAD models of the one or more parts through the input,
reads the set of the analysis information, the set of the mesh conditions, and the set of the analysis conditions, which are associated with the set of the CAD data and stored in the storage unit,
calculates an estimated analysis time which is to be taken for a following CAE analysis on the set of the CAD data based on the read set of the analysis information, set of the mesh conditions, and set of the analysis conditions, and a set of current hardware information of the management system, and
displays in the display the calculated estimated analysis time.

5. A management method of CAD data in a management system of CAD data, the management system comprising:
a storage unit which stores a set of CAD data together with a set of one or more mesh conditions under which a CAE model is created from the set of the CAD data and a set of one or more analysis conditions under which CAE analysis on the created CAE model is performed associated with the set of the CAD data, and the management method comprising the steps of:
to perform the CAE analysis on the set of the CAD data,
reading from the storage unit the set of the CAD data, the set of the mesh conditions and the set of the analysis conditions associated with the set of the CAD data;
creating the CAE model from the set of the CAD data under the read set of the mesh conditions;
performing the CAE analysis on the created CAE model under the read set of the analysis conditions;
storing an analysis time which has been taken for the CAE analysis using the stored combination of the set of the CAD data, the set of the mesh conditions, and the set of the analysis conditions; and reading from the storage unit and displaying in the display the stored analysis time associated with the stored combination of the set of the CAD data, the set of the mesh conditions, and the set of the analysis conditions before the CAE analysis is performed.

6. The management method of CAD data in a management system of CAD data according to claim 5, further comprising:

storing, in association with the corresponding analysis time which has been taken for the CAE analysis on the set of the CAD data, the set of the CAD data, the set of the mesh conditions, and the set of the analysis conditions, a set of analysis hardware information which is a set of information about hardware which has been used for the CAE analysis;

reading the set of the analysis time, the set of analysis hardware information, the set of the mesh conditions, and the set of the analysis conditions, which are associated with the set of the CAD data and stored in the storage unit; and calculating an estimated analysis time for a following CAE analysis on the set of the CAD data based on the read set of the analysis time, set of analysis hardware information, set of the mesh conditions, and set of the analysis conditions, and a set of current hardware information of the management system, and displaying the calculated estimated analysis time, wherein a set of information including the estimated analysis time is displayed before the CAE analysis is performed.

* * * * *